US006507232B2

United States Patent
Matsui (12) United States Patent
(10) Patent No.: US 6,507,232 B2
(45) Date of Patent: *Jan. 14, 2003

(54) SEMICONDUCTOR DEVICE WHICH CAN BE SET TO PREDETERMINED CAPACITANCE VALUE WITHOUT INCREASE OF DELAY TIME

(75) Inventor: Yoshinori Matsui, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/339,233

(22) Filed: Jun. 24, 1999

(65) Prior Publication Data

US 2002/0044001 A1 Apr. 18, 2002

(30) Foreign Application Priority Data

Jul. 9, 1998 (JP) .......................................... 10-194184

(51) Int. Cl.[7] .............................. G06F 7/64; G06G 7/18
(52) U.S. Cl. ...................... 327/337; 327/334; 361/91.1; 361/91.2
(58) Field of Search ................................ 327/334, 337, 327/283, 554, 393, 379, 389, 419, 427, 434, 108, 382, 288, 394–396; 361/90, 56, 91.2, 91.1

(56) References Cited

U.S. PATENT DOCUMENTS

| 3,433,937 | A | * | 3/1969 | McCarthy .................... 327/337 |
| 3,889,133 | A | * | 6/1975 | Oka et al. .................... 327/434 |
| 4,687,949 | A | * | 8/1987 | Yasuda ........................ 327/382 |
| 4,894,791 | A | * | 1/1990 | Jiang et al. .................. 327/393 |
| 5,041,741 | A | * | 8/1991 | Steele .......................... 326/33 |
| 5,107,153 | A | * | 4/1992 | Osaki et al. ................. 327/288 |
| 5,329,174 | A | * | 7/1994 | Chiang ........................ 327/313 |
| 5,831,457 | A | * | 11/1998 | McClure ...................... 327/379 |
| 5,905,398 | A | * | 5/1999 | Todsen et al. ............... 327/337 |
| 5,999,042 | A | * | 12/1999 | Hemdal et al. .............. 327/554 |
| 6,066,973 | A | * | 5/2000 | Sekino et al. ................ 327/427 |
| 6,072,351 | A | * | 6/2000 | Sharpe-Geisler ............. 361/91 |

FOREIGN PATENT DOCUMENTS

| JP | 64-74737 | 3/1989 |
| JP | 01-308060 | 12/1989 |
| JP | 1-319308 | 12/1989 |
| JP | 02-183622 | 7/1990 |
| JP | 3-18109 | 1/1991 |
| JP | 3-138962 | 6/1991 |
| JP | 04-147674 | 5/1992 |
| JP | 04-291951 | 10/1992 |
| JP | 05-268013 | 10/1993 |
| JP | 06-151716 | 5/1994 |
| JP | 6-260636 | 9/1994 |
| JP | 7-154222 | 6/1995 |
| JP | 10-51308 | 2/1998 |

* cited by examiner

Primary Examiner—Terry D. Cunningham
Assistant Examiner—Long Nguyen
(74) Attorney, Agent, or Firm—Sughrue Mion, PLLC (57) ABSTRACT

A semiconductor device includes an input and output section, an internal circuit section, and a capacitance section. A signal is inputted to or outputted from the input and output section. The internal circuit section receives the signal inputted to the input and output section or outputs the signal via the input and output section. The capacitance section includes a capacitance connected to the input and output section. The signal is outputted on a signal transmitting line from the internal circuit section to the input and output section. The capacitance section is provided on a conductive line different from the signal transmitting line.

12 Claims, 6 Drawing Sheets

SEMICONDUCTOR DEVICE WHICH CAN BE SET TO PREDETERMINED CAPACITANCE VALUE WITHOUT INCREASE OF DELAY TIME

BACKGROUND OF THE INVENTION

1. Field of the Invention

The present invention relates to a semiconductor device. More particularly, the present invention relates to a semiconductor device having an element for adjusting a capacitance value of an input terminal.

2. Description of the Related Art

As for a capacitance value of an input terminal of a memory device such as DRAM or the like, not only the maximum value thereof but also the minimum value thereof is specified as a standard, because of a fact that a memory bus is becoming faster in recent years and other reasons. For this reason, in order to satisfy a lower limit of the capacitance value of the input terminal, it is necessary to connect a capacitance element to the input terminal.

Figure 1:
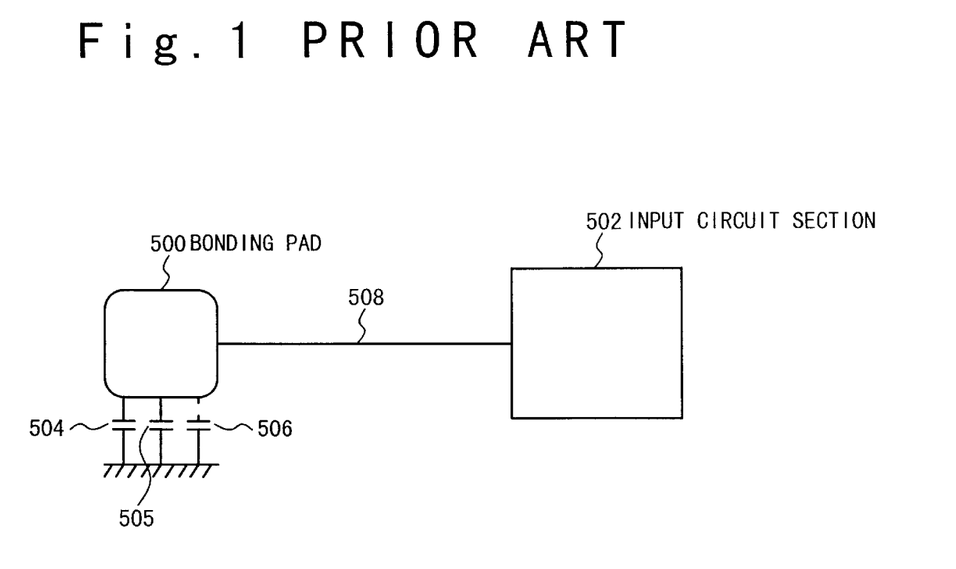
FIG. 1 is a view showing a semiconductor device of a conventional technique.

Traditionally, the technique as shown in FIG. 1 as an element (hereafter, referred to as a capacitance adjusting element) to adjust such a capacitance value of an input terminal is disclosed in Japanese Laid Open Patent Application (JP-A-Heisei 3-138962).

As shown in FIG. 1, an input circuit section 502 is connected through a wiring 508 to a bonding pad 500. A plurality of MOS-type capacitance elements 504, 505 and 506 are located adjacently to the bonding pad 500. A lower electrode of these MOS-type capacitance elements 504, 505 and 506 is a grounded silicon substrate. Respective upper electrodes are provided on the silicon substrate through dielectric film formed of silicon oxide. The respective upper electrodes are connected through fuses (not shown) to the bonding pad 500.

Since the fuses of the MOS-type capacitance elements 504, 505 are not cut off, the capacitance (capacities) thereof are connected to the bonding pad 500. Since the fuse of the MOS-type capacitance element 506 is cut off, the capacitance of the MOS-type capacitance element 506 is not connected to the bonding pad 500. In this way, the utilization of the fuse enables the connected capacitance value to be adjusted.

However, such an MOS-type capacitance element usually requires a large area and separately requires a process of forming itself. Here, also in a case of using a PN junction type capacitance element instead of the MOS-type capacitance elements 504, 505 and 506, a large area is typically required, and a process of forming itself is separately required.

The inventor of the present invention noticed that an input circuit of the input circuit section was composed of insulated gate field effect transistors (hereafter, referred to as MOS-transistors). As a result, the inventor of the present invention thought that the MOS-transistors as capacitance adjusting elements (MOS-transistors instead of the MOS-type capacitance elements 504, 505 and 506) should be formed, separately from the MOS-transistors for operating the input circuit section (the MOS-transistor of the above-mentioned input circuit).

The MOS-transistors as capacitance adjusting elements is formed with the present device process of the MOS-transistor. Thereby a gate oxide film serving as a capacitance insulating film of the capacitance adjusting element can be thinned to about 10 nm to thereby reduce an area occupied by the capacitance adjusting element. Moreover, it can be formed simultaneously with the MOS-transistor for operating the input circuit section. Thus, the process of forming the capacitance adjusting element is not additionally required.

For example, if using the device process to form the capacitance adjusting element composed of the MOS-transistors each having a gate oxide film of about 10 nm, the area thereof can be reduced to ⅙ or less of an area of a PN junction type capacitance element having the same performance.

In this case, it is necessary that an input protecting resistor is provided between the bonding pad and each of the MOS-transistor for operating the input circuit section and the MOS-transistor as the capacitance adjusting element, to protect the electrostatic breakdown in each gate oxide film.

Here, a delay amount when an input signal entered to the bonding pad is transmitted to the input circuit section is determined by a product of a resistor value R and a capacitance value C between the bonding pad and the input circuit section.

A value of a parasitic resistance of the wiring is sufficiently smaller than the resistor value of the input protecting resistor. Thus, the resistor value R is determined in accordance with a resistor value $R_P$ of the input protecting resistor. On the other hand, the capacitance value C includes a parasitic capacitance $C_A$ of element and wiring which is parasitic at a node (contact) between the input circuit section and the input protecting resistor and a capacitance value $C_B$ of the MOS-transistor serving as the capacitance adjusting element. Hence, the input signal entered to the bonding pad is delayed by a time corresponding to a time constant $R_P \times (C_A + C_B)$ when the input signal is transmitted to the input circuit section.

Figure 2:
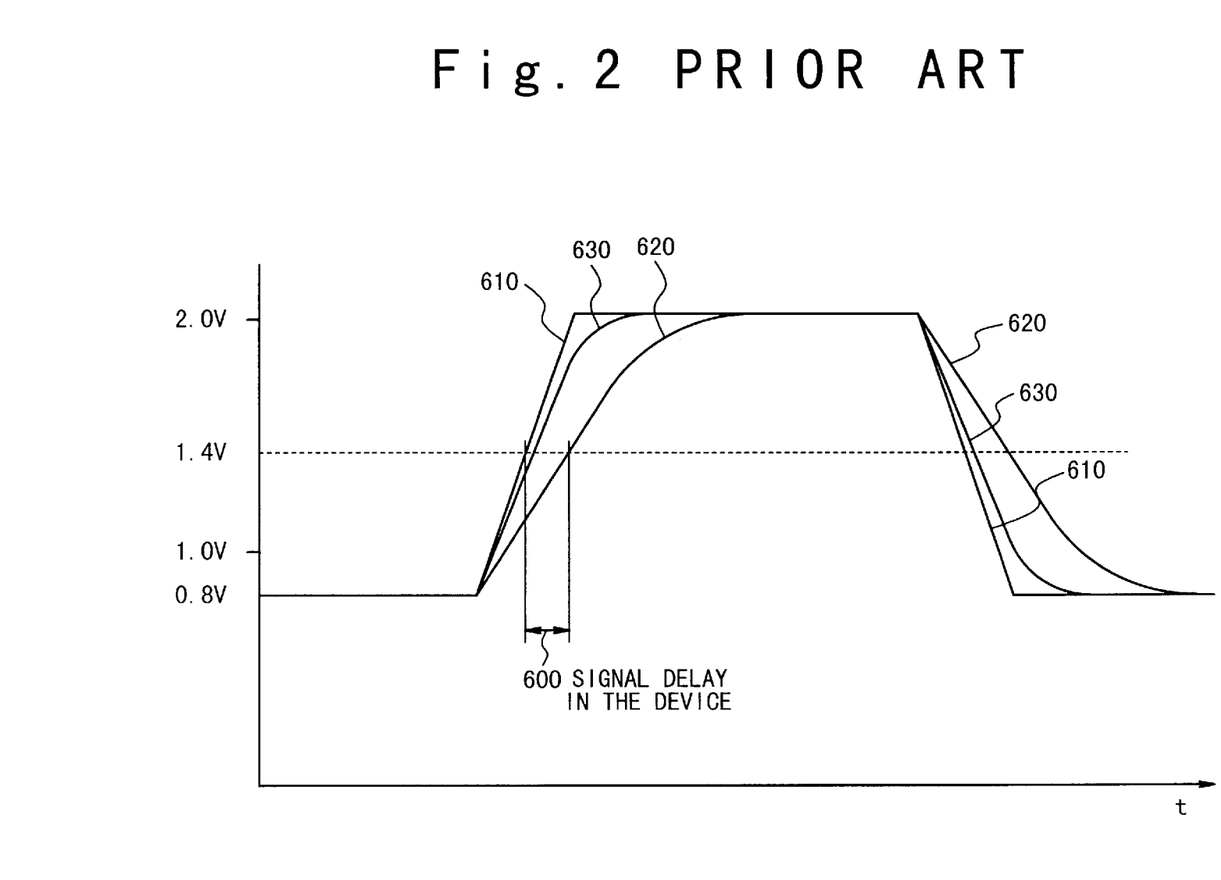
FIG. 2 is a view showing a relation between a time and a potential of an input signal.

FIG. 2 shows a signal wave form at this time. In FIG. 2, a symbol 610 denotes a signal wave form in the bonding pad. A symbol 620 denotes a signal wave form in the input circuit section transmitted under the delay of the time corresponding to the time constant $R_P \times (C_A + C_B)$.

In FIG. 2, an input level is indicated in a typical LVTTL (Low Voltage Transistor-Transistor Logic) interface. As shown in a delay time 600 of FIG. 2, a signal 610 from external environment has a large delay amount in the device, and it is then transmitted to the input circuit section.

Actually, let us estimate this delay amount in a case of a 64 MSDRAM (64 megabits of Synchronous Dynamic Random Access Memory) which is presently typically used. As a standard value of the capacitance of the input terminal, its upper limit is defined as 4 pF, its lower limit is defined as 2.5 pF, and its intermediate value is 3.3 pF. In a high speed DRAM such as a SDRAM and the like, the signal delay in the device after the input protecting resistor causes an access speed value of the device to be increased and also causes the performance to be deteriorated.

Thus, the layout is typically designed such that the bonding pad and the input circuit section are as close as possible to each other, so as to suppress the parasitic capacitance $C_A$ of the device and the wiring which is parasitic at the node between the input circuit section and the input protecting resistor. In a case of 64 MSDRAM, the parasitic capacitance $C_A$ is about 0.1 pF.

On the other hand, parasitic capacitance values at a pad, an input protecting element, a lead frame and the like between the bonding pad and the input circuit of the device other than the above-mentioned parasitic capacitance $C_A$ are about 1.7 pF. Thus, in order to satisfy the standard value, it is necessary to further add (connect) a capacitance $C_B$ of about 1.5 pF to thereby set the capacitance of the input terminal to the intermediate value 3.3 pF in total. The value $R_P$ of the input protecting resistor is about 350 Ω. Hence, the delay time of the signal in the device is represented in time constant as follows:

$$350\ \Omega \times (0.1\ \text{pF} + 1.5\ \text{pF}) = 560\ \text{pS}.$$

This value is large to an extent that it can not be ignored for 2.0 nS and 1.0 nS of the setup and hold standard values with regard to an input signal.

These delay amounts are generated as the relative delay time of the device operation with respect to the signal entered in the device. Thus, they are regarded as the deterioration of the performance of the device. As mentioned above, the conventional technique shown in FIG. 1 needs the large area in order to form the capacitance adjusting element. Thus, the integration degree is sacrificed. Also, it additionally needs the process of forming the capacitance adjusting element. Hence, the manufacturing process becomes complex, which results in interference with reduction of a manufacturing cost.

On the other hand, if trying to utilize the device process of the MOS transistor directly when forming the capacitance adjusting element, this trial causes the delay of the input signal to be larger so that the device performance is deteriorated.

Therefore, an object of the present invention is to provide a semiconductor device which can adjust an input terminal (bonding pad) to have a predetermined capacitance value without needing a large area and increasing a manufacturing process and further making a delay time of an input signal larger.

In addition, the following techniques are disclosed as the technique in relation to the above-mentioned semiconductor device.

At first, the following capacity adjusting circuit is disclosed in Japanese Laid Open Patent Application (JP-A-Heisei 1-319308). This capacity adjusting circuit contains a capacitance group in which a plurality of rectangular parallelepipeds of capacitances and switches are connected in parallel and an operational circuit for selectively opening and closing the switches in accordance with a signal sent from external two terminals so that a capacitance value of this capacitance group is suitably changed.

The following integrated circuit amplitude suppressing unit is disclosed in Japanese Laid Open Patent Application (JP-A-Heisei 3-18109). In this integrated circuit amplitude suppressing unit, an amplitude suppressing circuit has two input terminals of a positive phase and a negative phase and similarly two output terminals of a positive phase and a negative phase, and then performs negative feedback on the respective inputs of the negative phase and the positive phase through resistors from the output of the positive phase and the negative phase, and further has $n_1$ sets of parallel protective diodes on the input side of the positive phase and $n_2$ sets (or $n_1$ sets) of parallel protective diodes on the input side of the negative phase.

The following input protection circuit is disclosed in Japanese Laid Open Patent Application (JP-A-Heisei 6-260636). In this input protection circuit, a p-channel transistor and an n-channel transistor are connected in series between a power supply voltage terminal and a ground. A floating gate is provided between a gate electrode and a gate insulating film in each of those transistors. A write gate from which predetermined charges are injected is formed at a part of the floating gate. The predetermined charges are injected from the write gate to the floating gate so that a threshold voltage is established so as to reduce a channel leak current of each transistor to a minimum. Accordingly, this can prevent a consumption power from increasing when the input protection circuit is driven.

The following "Delay Line Having A Plurality of Cells And Method for Calibrating Delay Line" is disclosed in Japanese Laid Open Patent Application (JP-A-Heisei 7-154222). In the technique disclosed in this gazette, the delay line includes an array of cells connected in series. Each cell contains a pair of CMOS transistors. Gates of both the MOS transistors are connected to an input terminal of each cell, and drains of both the MOS transistors are connected to an output terminal of each cell. Each source terminal is connected through a digitally controllable load to a bias potential. The load is an array composed of a PMOS transistor and an NMOS transistor, and then adds a resistance and a capacitance in parallel, and further controls the transmission performance of the cell. The load can be adjusted by applying a logical signal to a selected gate of the array in series. At first, all switches (logical gates) between the bias potential and the gates are opened to increase the delay amount to the maximum. Then, the switches are continuously opened so as to shift a transition end of the transmission signal.

SUMMARY OF THE INVENTION

The present invention has been made to solve the above-described problems of the conventional semiconductor device. An object of the present invention is to provide a semiconductor device which can adjust an input terminal (bonding pad) to have a predetermined capacitance value without needing a large area and increasing a manufacturing process and further making a delay time of an input signal larger.

In order to achieve an aspect of the present invention, a semiconductor device includes an input and output section to and from which a signal is inputted or outputted, an internal circuit section 111 for receiving the signal inputted to the input and output section or for outputting the signal via the input and output section and a capacitance section including a capacitance connected to the input and output section, wherein the signal is outputted on a signal transmitting line from the internal circuit section to the input and output section, and the capacitance section is provided on a conductive line different from the signal transmitting line.

In order to achieve another aspect of the present invention, a semiconductor device includes an input and output section to and from which a signal is inputted or outputted, an internal circuit section for receiving the signal inputted to the input and output section or for outputting the signal via the input and output section, a first protecting resistor provided on a signal transmitting line between the input and output section and the internal circuit section to protect the internal circuit section, a capacitance section including a capacitance connected to the input and output section and a second protecting resistor connected between the input and output section and the capacitance section to protect the capacitance section, wherein the capacitance section and the second protecting resistor are provided on a conductive line different from the signal transmitting line.

In order to achieve still another aspect of the present invention, a semiconductor device includes an input and output section to and from which a signal is inputted or outputted, an internal circuit section for receiving the signal inputted to the input and output section or for outputting the signal via the input and output section, a first protecting resistor provided on a signal transmitting line between the input and output section and the internal circuit section to protect the internal circuit section, a capacitance section including a capacitance connected to the input and output section and a second protecting resistor connected between the input and output section and the capacitance section to protect the capacitance section, wherein the capacitance section is connected to the input and output section only through the second protecting resistor of the first and second protecting resistors.

In this case, the capacitance section has a plurality of insulation gate field effect transistors or a plurality of MOS-type capacitance elements.

Also in this case, the internal circuit section has an insulation gate field effect transistor, and a gate insulating film of the insulation gate field effect transistor of the internal circuit section is identical in material and film thickness to each of gate insulating films of the plurality of insulation gate field effect transistors in the capacitance section or each of dielectric films of the plurality of MOS-type capacitance elements in the capacitance section.

Further in this case, potentials of a source portion, a drain portion and a channel portion of each of the plurality of insulation gate field effect transistors in the capacitance section are a ground potential, and a gate portion of that is connected through the conductive line to the input and output section.

Also in this case, a potential of a substrate serving as a lower electrode of each of the plurality of MOS-type capacitance elements in the capacitance section is a ground potential, and an upper electrode of that is connected through the conductive line to the input and output section.

Further in this case, the gate portion of at least one, as a selected transistor, selected of the plurality of insulation gate field effect transistors in the capacitance section is connected through the conductive line to the input and output section, and the gate portion of a non-selected transistor other than the selected transistor of the plurality of insulation gate field effect transistors is connected to the ground.

In this case, the upper electrode of at least one, as a selected capacitance element, selected of the plurality of MOS-type capacitance elements in the capacitance section is connected through the conductive line to the input and output section, and the upper electrode of a non-selected capacitance element other than the selected capacitance element of the plurality of MOS-type capacitance elements is connected to the ground.

Also in this case, capacitance values between gate electrodes of the plurality of insulation gate field effect transistors in the capacitance section and a substrate, in which the plurality of insulation gate field effect transistors are formed, are substantially equal to each other, or capacitance values between the upper electrodes and the lower electrodes of the plurality of MOS-type capacitance elements in the capacitance section are substantially equal to each other.

Further in this case, the plurality of insulation gate field effect transistors or the plurality of MOS-type capacitance elements in the capacitance section are arrayed parallel to each other in one direction and capacitance values of them are sequentially increased or decreased in the arrayed direction.

In this case, the capacitance values are sequentially increased or decreased in arithmetical series or geometrical series in the arrayed direction.

Also in this case, the input and output section is a bonding pad.

Further in this case, each of the first and second protecting resistors is formed of polysilicon.

In order to achieve yet still another aspect of the present invention, a semiconductor device includes an input and output section to and from which a signal is inputted or outputted, an internal circuit section for receiving the signal inputted to the input and output section or for outputting the signal via the input and output section, a first wiring for connecting the input and output section to the internal circuit section and a capacitance adjusting section for adjusting a capacitance connected to the input and output section, wherein the capacitance adjusting section is connected to a second wiring which is different from the first wiring and is connected to the input and output section without being connected to the internal circuit section.

In this case, the semiconductor device further includes a first protecting resistor connected between the input and output section and the internal circuit section on the first wiring to protect the internal circuit section.

Also in this case, the semiconductor device further includes a second protecting resistor connected between the input and output section and the capacitance adjusting section on the second wiring to protect the capacitance adjusting section.

In order to achieve another aspect of the present invention, a method of manufacturing a semiconductor device having an internal circuit section for receiving a signal inputted to an input and output section or for outputting a signal via the input and output section and a capacitance section including a capacitance connected to the input and output section, includes (a) providing a semiconductor substrate, (b) forming a first oxide film serving as a gate oxide film of a first MOS-transistor of the internal circuit section on the semiconductor substrate, (c) forming a gate electrode of the first MOS-transistor on the first oxide film, (d) forming a source region and a drain region of the first MOS-transistor in the semiconductor substrate, (e) forming a second oxide film serving as a gate oxide film of a second MOS-transistor of the capacitance section on the semiconductor substrate while the (b) step is performed, (f) forming a gate electrode of the second MOS-transistor on the second oxide film while the (c) step is performed and (g) forming a source region and a drain region of the second MOS-transistor in the semiconductor substrate while the (d) step is performed.

In order to achieve still another aspect of the present invention, a method of manufacturing a semiconductor device having an internal circuit section for receiving a signal inputted to an input and output section or for outputting a signal via the input and output section and a capacitance section including a capacitance connected to the input and output section, includes (h) providing a semiconductor substrate, (i) forming a first oxide film serving as a gate oxide film of a MOS-transistor of the internal circuit section on the semiconductor substrate, (j) forming a gate electrode of the MOS-transistor on the first oxide film, (k) forming a source region and a drain region of the MOS-transistor in the semiconductor substrate, (l) forming a second oxide film serving as a dielectric film of a MOS-capacitance of the capacitance section on the semiconductor substrate while the (i) step is performed, (m) forming an upper electrode of the MOS-capacitance on the second oxide film while the (j) step is performed and (n) masking a surface portion of the semiconductor substrate located in a side of the upper electrode when the (k) step is performed such that source and drain regions are not formed in the semiconductor substrate.

In this case, the method of manufacturing a semiconductor device further includes (o) forming a first protecting resistor for protecting the gate oxide film of the first MOS-transistor and a second protecting resistor for protecting the gate oxide film of the second MOS-transistor, while the (c) step is performed.

Also in this case, the method of manufacturing a semiconductor device according to claim 19, further includes (p) forming a first protecting resistor for protecting the gate oxide film and a second protecting resistor for protecting the dielectric film (E), while the (j) step is performed.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various preferred embodiments according to the present invention will be described in detail.

Figure 3:
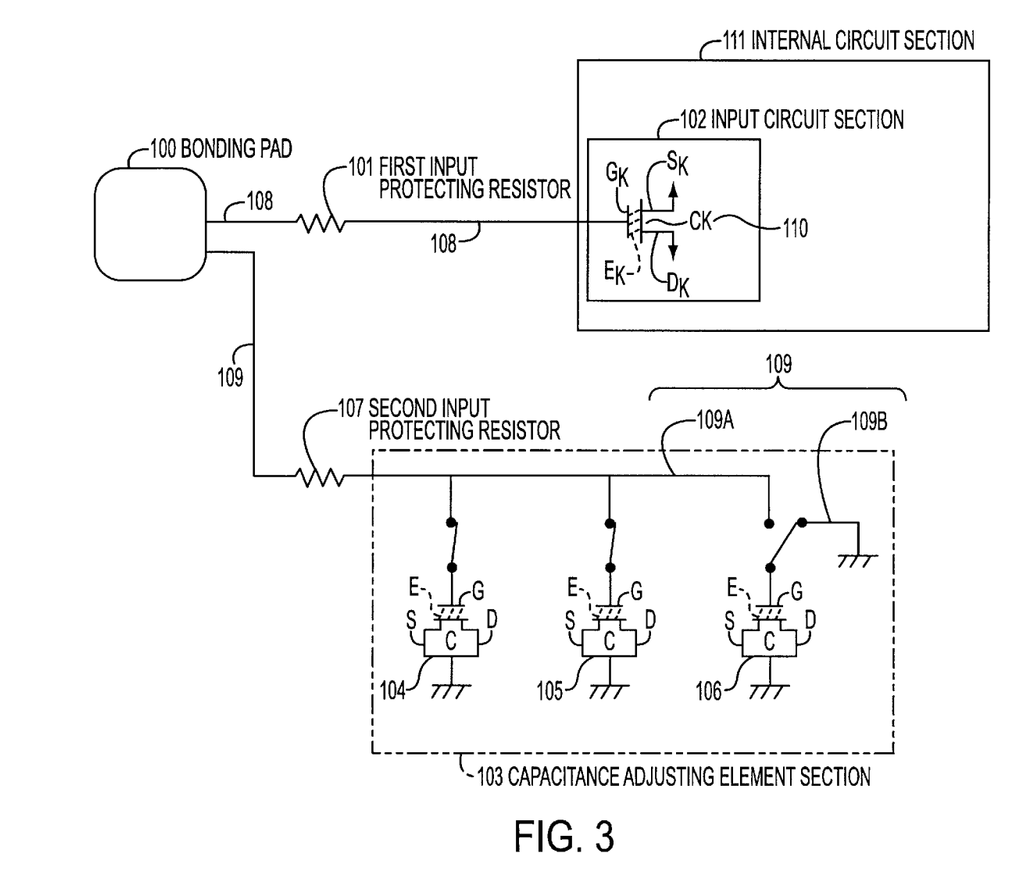
FIG. 3 is a view showing the first embodiment of the present invention.

FIG. 3 is a view showing the first embodiment of the present invention. An N-channel MOS-transistor 110 for serving as an original input circuit is provided in an input circuit section 102. This MOS-transistor 110 is provided with a gate insulating film Ek formed on a P-type silicon substrate, a gate electrode Gk formed on the gate insulating film Ek, an N-type source region Sk and an N-type drain region Dk.

The gate insulating film Ek is formed of silicon oxide having a film thickness of 10 nm formed by thermal oxidation on the P-type silicon substrate, namely, on a P-type channel region Ck. The gate electrode Gk is formed of polysilicon. The N-type source region Sk and the N-type drain region Dk are formed in self-alignment to the gate electrode Gk.

This input circuit section 102 is connected through a first input protecting resistor 101 to a bonding pad 100 with a wiring 108. The first input protecting resistor 101 is made of polysilicon and has a resistance of 350 Ω. If a serge voltage is entered in the bonding pad 100, the first input protecting resistor 101 protects the gate insulating film Ek of the MOS-transistor 110 such that the electrical breakdown in the gate insulating film Ek is not occurred.

In a capacitance adjusting element section 103, many MOS-transistors are arrayed in a direction (a lateral direction in FIG. 3) as the capacitance adjusting element. In FIG. 3, three MOS-transistors 104, 105 and 106 are illustrated as a example. Each of the MOS-transistors 104, 105 and 106 serving as the capacitance adjusting elements is composed of a gate electrode G formed on a gate insulating film E, an N-type source region S and an N-type drain region D.

The gate insulating film E is formed of silicon oxide having a film thickness of 10 nm formed by the thermal oxidation on the P-type silicon substrate, namely, on a P-type channel region C. The gate electrode G is formed of polysilicon. The N-type source region S and the N-type drain region D are formed in self-alignment with regard to the gate electrode G.

The MOS-transistors 104, 105 and 106 are manufactured in the same manufacturing process as the MOS-transistor 110 of the input circuit section 102. Thus, the gate oxide films E of the MOS-transistors 104, 105 and 106 are formed of the same material having the same film thickness as the gate oxide film Ek of the MOS-transistor 110. That is, the gate oxide films E of the MOS-transistors 104, 105 and 106 are formed by using a device process of a hyper-fine MOS-transistor. Hence, the film thicknesses thereof are thin.

The source region S, the drain region D and the channel region C formed in the substrate of the MOS-transistors 104, 105 and 106 are connected to a ground, and the thus-grounded substrate serves as a lower electrode of the MOS-capacitance element. The thin gate insulating film E having the film thickness of 10 nm on the substrate serves as a dielectric film of the MOS-capacitance element. The gate electrode G on the gate insulating film E serves as an upper electrode of the MOS-capacitance element. Each of the MOS-transistors 104, 105 and 106 has the structure of the MOS-capacitance element.

Of the MOS-transistors 104, 105 and 106, the gate electrodes G of the MOS-transistors 104, 105 are connected through a first portion 109A of a wiring 109 to one end of a second input protecting resistor 107. The wiring 109 is formed with a metallic film of chromium, aluminum and the like. The other end of the second input protecting resistor 107 is connected through the wiring 109 to the bonding pad 100. The second input protecting resistor 107 is formed of polysilicon and has a resistance of 350 Ω.

Accordingly, the MOS-capacitance values of the MOS-transistors 104, 105 are entered (added or connected) to the bonding pad 100. Then, if the serge voltage is induced in the bonding pad 100, the second input protecting resistor 107 prevents the gate insulating films E of the MOS-transistors 104, 105 from being statically broken down. The second input protecting resistor 107 stops an occurrence of an electrical breakdown in the gate insulating films E of the MOS-transistors 104, 105.

On the other hand, the gate electrode G of the MOS-transistor 106 is connected through a second portion 109B of the wiring 109 to the ground. Thus, the MOS-capacitance value of this MOS-transistor 106 is not entered (added or connected) to the bonding pad 100.

The wiring 109 is connected through contact holes disposed in an inter-layer insulating film to the respective gate electrodes G of the MOS-transistors 104, 105 and 106.

The pattern of the wiring 109 determines which gate electrode G of the MOS-transistors 104, 105 and 106 of them 104, 105 and 106 is connected through the first portion 109A of the wiring 109 and the second input protecting resistor 107 to the bonding pad 100 and which gate electrode G of the MOS-transistors 104, 105 and 106 is connected through the second portion 109B of the wiring 109 to the ground. Thus, the pattern of the wiring 109 is designed such that the bonding pad 100 obtains a predetermined capacitance amount.

In this first embodiment, when the MOS-capacitance value of the MOS-transistor 104 is C104, the MOS-capacitance value of the MOS-transistor 105 is C105, and the MOS-capacitance value of the MOS-transistor 106 is C106, we have the relation of C104=C105=C106. That is, since the MOS-transistors 104, 105 and 106 using the same dielectric film E have the mutual same areas (the areas of the gate insulating films E on which the gate electrodes G overlap with each other), we have the mutual same MOS-capacitance value of C104=C105=C106.

The MOS-transistors 104, 105 and 106 have the same MOS-capacitance value C104=C105=C106. Thus, as shown in FIG. 3, the MOS-transistors whose gate electrodes G are connected to the bonding pad 100 (104 and 105 in FIG. 3) are selected from one side (a left side of FIG. 3) in the array direction of the MOS-transistors 104, 105 and 106, and the MOS-transistor (106 in FIG. 3) whose gate electrode G is connected to the ground is selected from the other side (a right side of FIG. 3). This manner makes the pattern configuration of the wiring 109 (109A, 109B) easier.

In this embodiment, the MOS-transistors 104, 105 and 106 serving as the capacitance adjusting element are formed under the same configuration as the MOS-transistor 110 serving as the circuit element. Thus, the area required to attain a desirable capacitance can be reduced to further simplify the manufacturing process.

Moreover, the second input protecting resistor 107 for protecting the static breakdown in the MOS-transistors 104, 105 and 106 of the capacitance adjusting element section 103 is provided separately from the first input protecting resistor 101 for protecting the static breakdown in the MOS-transistor 110 for operating the input circuit section 102. Hence, the input signal inputted to the bonding pad 100 can be transmitted to the input circuit section 102 under a short delay time, regardless of the presence of the capacitance adjusting element section 103.

As mentioned above, the time constant if this embodiment is not used, is represented by $R_P \times (C_A+C_B)$ when letting the parasitic capacitance of the element and the wiring which is parasitic at the node between the input circuit section and the input protecting resistor be $C_A$, the capacitance of the capacitance adjusting element be $C_B$, and the resistance of the input protecting resistor be $R_P$. So, we have a large value of 350 Ω×(0.1 pF+1.5 pF)=560 pS.

However, in the configuration of this embodiment, the capacitance $C_B$ of the capacitance adjusting element has no influence on the delay in the transmission of the signal. Thus, the time constant is represented by $R_P \times C_A$. So, the delay time of the signal in the device after the input protecting resistor is 350Ω×0.1 pF=35 pS in time constant. Hence, this is a sufficiently small delay amount. That is, this shortens the delay time from an external signal 610, as shown in a wave form 630 of FIG. 2.

Figure 4:
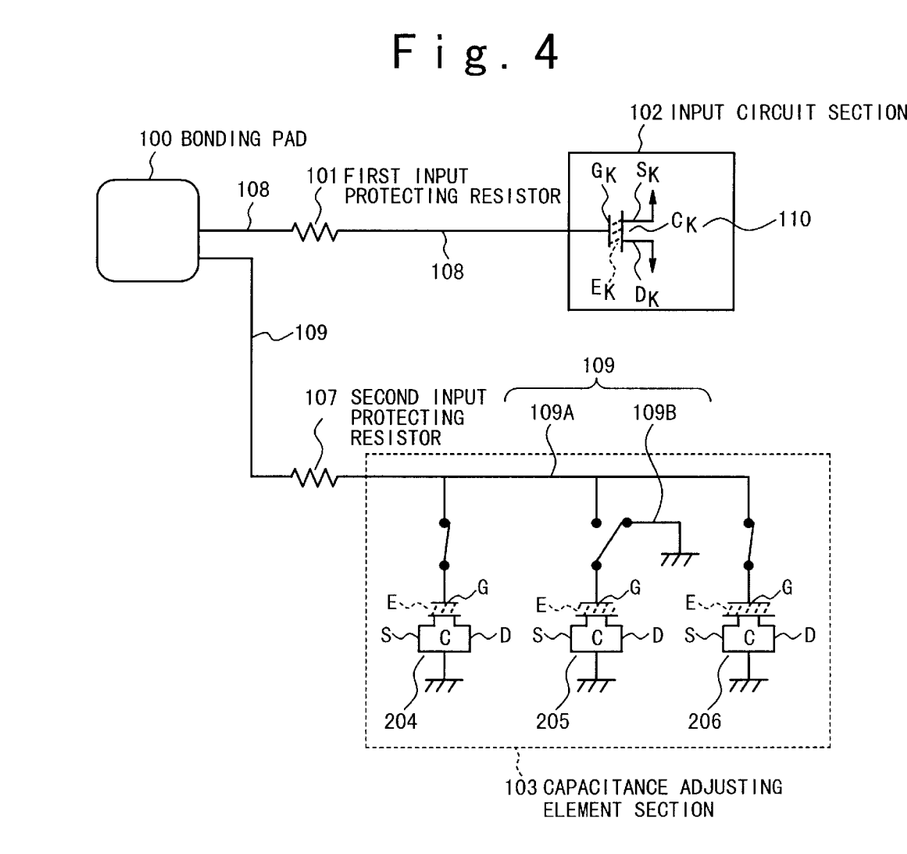
FIG. 4 is a view showing the second embodiment of the present invention.
Figure 5:
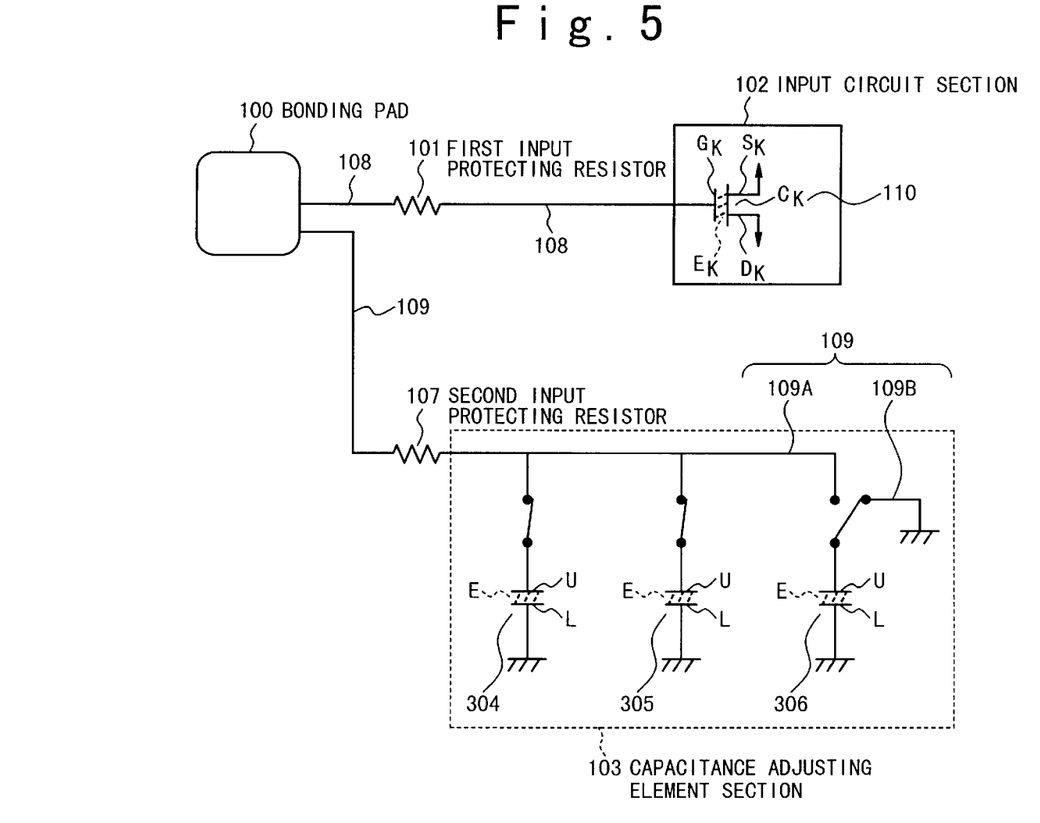
FIG. 5 is a view showing the third embodiment of the present invention.
Figure 6:
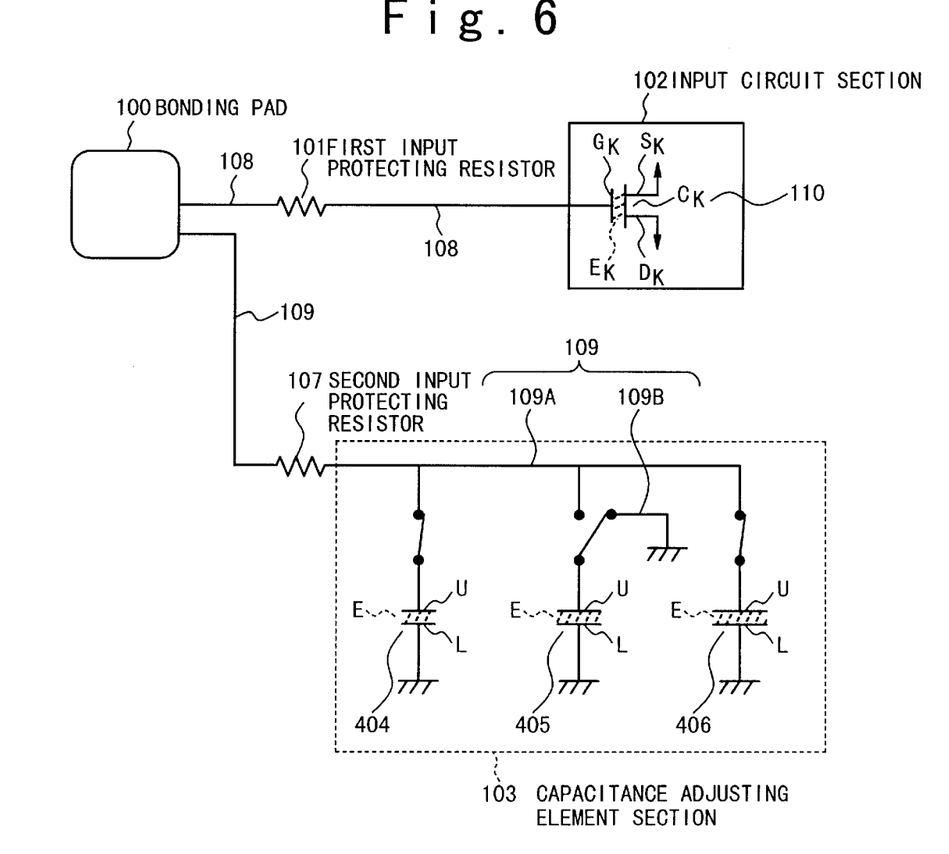
FIG. 6 is a view showing the fourth embodiment of the present invention.

FIGS. 4, 5 and 6 are views showing the second, third and fourth embodiments in the present invention, respectively. Incidentally, in FIGS. 4 to 6, the components identical or similar to those of FIG. 3 are given the same symbols. Thus, the duplicate explanations are omitted.

In the second embodiment shown in FIG. 4, MOS-capacitance values of MOS-transistors 204, 205 and 206 for the capacitance adjusting element are increased in sequence. That is, let the MOS-capacitance value of the transistor 204 be C204, the MOS-capacitance value of the transistor 205 be C205, and the MOS-capacitance value of the transistor 206 be C206. So, we have the relation of C204<C205<C206.

In this case, it is possible to increase or decrease in arithmetical series for (C206-C205)=(C205-C204). Or, it is possible to increase or decrease in geometrical series for (C206/C205)=(C205/C204).

Gate insulating films (dielectric films) E of the MOS-transistors 204, 205 and 206 are all formed of the same material having the same film thickness as the gate insulating film Ek of the MOS-transistor 110 serving as the circuit element. Thus, in order to obtain the MOS-capacitance values different from each other, it is designed that areas (areas of the gate insulating films E on which the gate electrodes G overlap with each other) are different from each other.

Since the MOS-capacitance values different from each other are prepared in this second embodiment, this is suitable for the precise control of the value of the capacitance connected to the bonding pad 100. In the first and second embodiments, each of the capacitance adjusting elements 104, 105, 106, 204, 205 and 206 has the source region S and the drain region D. Thus, they can be manufactured similarly to the MOS-transistor serving as the circuit element.

On the contrary, if the existences of the drain region D and the source region S are not desirable as the MOS-capacitance, the capacitance adjusting element section 103 is masked when forming the source region Sk and the drain region Dk of the MOS-transistor 110 serving as the circuit element. Accordingly, the formations of the source region S and the drain region D can be omitted as in the third embodiment of FIG. 5 and the fourth embodiment of FIG. 6.

Also in the third and fourth embodiments, a P-type silicon substrate is used as a lower electrode L. Then, a dielectric film E formed of silicon oxide of 10 nm is formed on the silicon substrate by the thermal oxidation, simultaneously with the formation of the gate insulating film Ek of the N-channel MOS-transistor 110. Moreover, an upper electrode N formed of polysilicon thereon is formed simultaneously with the formation of the polysilicon gate electrode Gk of the N-channel MOS-transistor 110.

The thin dielectric film E to save the area is used in the thus-formed MOS-type capacitance elements 304, 305 and 306 (FIG. 5) and 404, 405 and 406 (FIG. 6), similarly to the gate insulating film E of the MOS-transistor in the first and second embodiments. Thus, the input protecting resistor is also required to protect the static breakdown in the dielectric film E. In this case, the second input protecting resistor 107 used here and those MOS-type capacitance elements 304, 305, 306, 404, 405 and 406 have no influence on the transmission of the input signal, similarly to the first and second embodiments. Hence, the delay time of the input signal is never increased.

FIG. 5 shows the third embodiment in response to that of FIG. 3. The MOS-type capacitance elements 304, 305 and 306 have the mutual same dielectric film E and also have the mutual same area (the area of the thin dielectric film E on which upper electrodes U overlap with each other). Thus, they have the mutual same MOS-capacitance value.

FIG. 6 shows the fourth embodiment in response to that of FIG. 4. The MOS-type capacitance elements 404, 405 and 406 have the dielectric films E having the same film thickness and the same material. However, it is designed that the areas (the areas of the thin dielectric films E on which upper electrodes U overlap with each other) are larger in sequence from the left side to the right side of FIG. 6. Thus, the MOS-capacitance values are increased in the arithmetical series or the geometrical series.

According to the above-mentioned first to fourth embodiments, the MOS-transistors 104 to 206 in which the MOS-device process is followed in order to make the occupation areas smaller and then the thin gate insulating films E are used as the dielectric films, or the MOS-type capacitance elements 304 to 406 in which the source and drain regions are omitted and similarly the thin dielectric films E are used are used as the capacitance adjusting element. Thus, even if the input protecting resistor 107 is required in order to protect the static breakdown in the thin gate insulating film E, this input protecting resistor 107 is the component different from the input protecting resistor 101 for protecting the static breakdown provided between the bonding pad 100 and the input circuit section 102. Hence, the above-mentioned embodiments can avoid the undesirable delay of the input signal.

As mentioned above, according to the present invention, the MOS-transistors in which the MOS-device process is followed to make the occupation areas smaller and then the thin gate insulating films are used as the dielectric films, or the MOS-type capacitance elements in which the source and drain regions are omitted and similarly the thin dielectric films are used are used as the capacitance adjusting element. Thus, even if the input protecting resistor is required in order to protect the static breakdown of the thin gate insulating film, this input protecting resistor is the component different from the input protecting resistor for protecting the static breakdown provided between the bonding pad and the input circuit section. Hence, the present invention can avoid the undesirable delay of the input signal.

What is claimed is:

1. A semiconductor device comprising:
    an input and output section to and from which a signal is inputted or outputted;
    an internal circuit section for receiving said signal inputted to said input and output section;
    a first protecting resistor provided on a signal transmitting line between said input and output section and said internal circuit section to protect said internal circuit section;
    a capacitance section including a plurality of capacitance elements that are selectively connected to, or disconnected from, said input and output section; and
    a second protecting resistor connected between said input and output section and said capacitance section to protect said capacitance section,
    wherein said capacitance section and said second protecting resistor are provided on a conductive line that is different from said signal transmitting line.

2. A semiconductor device according to claim 1, wherein said capacitance section has a plurality of insulation gate field effect transistors or a plurality of MOS-type capacitance elements.

3. A semiconductor device according to claim 2, wherein said internal circuit section has an insulation gate field effect transistor, and
    a gate insulating film of said insulation gate field transistor of said internal circuit section is identical in material and film thickness to each gate insulating film of said plurality of insulation gate field effect transistors in said capacitance section or each dielectric film of said plurality of MOS-type capacitance elements in said capacitance section.

4. A semiconductor device according to claim 2, wherein capacitance values between gate electrodes of said plurality of insulation gate field effect transistors in said capacitance section and a substrate, in which said plurality of insulation gate field effect transistors are formed, are substantially equal to each other, or capacitance values between upper electrodes and lower electrodes of said plurality of MOS-type capacitance elements in said capacitance section are substantially equal to each other.

5. A semiconductor device according to claim 2, wherein said plurality of insulation gate field effect transistors or said plurality of MOS-type capacitance elements in said capacitance section are connected in a parallel configuration and wherein capacitance values are sequentially increased or decreased from a first end to a second end of the parallel configuration.

6. A semiconductor device according to claim 5, wherein said capacitance values are sequentially increased or decreased in arithmetical series or geometrical series from the first end to the second end of the parallel configuration.

7. A semiconductor device according to claim 1, wherein said input and output section is a bonding pad.

8. A semiconductor device according to claim 1, wherein each of said first and second protecting resistors is formed of polysilicon.

9. A semiconductor device comprising:
    an input and output section to and from which a signal is inputted or outputted;
    an internal circuit section for receiving said signal inputted to said input and output section;
    a first protecting resistor provided on a signal transmitting line between said input and output section and said internal circuit section to protect said internal circuit section;
    a capacitance section including a plurality of capacitance elements that are selectively connected to, or disconnected from, said input and output section; and
    a second protecting resistor connected between said input and output section and said capacitance section to protect said capacitance section,
    wherein said capacitance section is connected to said input and output section only through said second protecting resistor, which is located on a different signal line from said first protecting resistor.

10. A semiconductor device comprising:
    an input and output section to and from which a signal is inputted or outputted;
    an internal circuit section for receiving said signal inputted to said input and output section; and
    a capacitance section including a capacitance element connected to said input and output section, said capacitance section being provided on a conductive line that is different from said signal transmitting line, wherein said capacitance section has a plurality of insulation gate field effect transistors or a plurality of MOS-type capacitance elements, and
    wherein voltage potentials of a source portion, a drain portion and a channel portion of each of said plurality of insulation gate field effect transistors in said capacitance section are at a ground potential, and a gate portion of said plurality of insulation gate field effect transistors is adapted to be connected to said input and output section through said conductive line, and
    wherein said gate portions of selected ones of said plurality of insulation gate field effect transistors in said capacitance section are connected to said input and output section through said conductive line, and non-selected ones of said gate portions of said plurality of insulation gate field effect transistors are connected to the ground potential.

11. A semiconductor device comprising:
    an input and output section to and from which a signal is inputted or outputted;
    an internal circuit section for receiving said signal inputted to said input and output section; and a capacitance section including a capacitance element connected to said input and output section, said capacitance section being provided on a conductive line that is different from said signal transmitting line, wherein said capacitance section has a plurality of insulation gate field effect transistors or a plurality of MOS-type capacitance elements, and wherein a voltage potential of a substrate serving as a lower electrode of each of said plurality of MOS-type capacitance elements in said capacitance section is at a ground potential, and wherein an upper electrode of said plurality of MOS-type capacitance elements is adapted to be connected to said input and output section through said conductive line, and wherein said upper electrodes of selected ones of said plurality of MOS-type capacitance elements in said capacitance section are connected to said input and output section through said conductive line, and non-selected ones of said upper electrodes of said plurality of MOS-type capacitance elements are connected to the ground potential.

12. A semiconductor device comprising:

an input and output section to and from which a signal is inputted or outputted;

an internal circuit section for receiving said signal inputted to said input and output section;

a first wiring for connecting said input and output section to said internal circuit section;

a capacitance adjusting section for adjusting a capacitance connected to said input and output section, wherein said capacitance adjusting section is connected to a second wiring which is different from said first wiring and is connected to said input and output section without being connected to said internal circuit section;

a first protecting resistor connected between said input and output section and said internal circuit section on said first wiring to protect said internal circuit section; and a second protecting resistor, provided on said second wiring that is different from said first wiring, said second protecting resistor being connected between said input and output section and said capacitance adjusting section to enable a signal received at said input and output section to be transmitted to the internal circuit section under a reduced time delay.

* * * * *